United States Patent
Huang et al.

(10) Patent No.: US 6,635,307 B2
(45) Date of Patent: Oct. 21, 2003

(54) MANUFACTURING METHOD FOR THIN-FILM SOLAR CELLS

(75) Inventors: Wen-Chiang Huang, Auburn, AL (US); Liangwei Wu, Auburn, AL (US)

(73) Assignee: Nanotek Instruments, Inc., Fargo, ND (US)

( * ) Notice: Subject to any disclaimer, the term of this patent is extended or adjusted under 35 U.S.C. 154(b) by 127 days.

(21) Appl. No.: 10/013,300

(22) Filed: Dec. 12, 2001

(65) Prior Publication Data

US 2003/0113481 A1 Jun. 19, 2003

(51) Int. Cl.⁷ .............................................. C23C 16/517
(52) U.S. Cl. ............................ 427/74; 427/76; 427/78; 427/580; 204/192.38
(58) Field of Search ............................ 427/580, 74, 76, 427/78; 204/192.38

(56) References Cited

U.S. PATENT DOCUMENTS

| | | |
|---|---|---|
| 3,752,610 A | 8/1973 | Galzunov et al. |
| 3,887,667 A | 6/1975 | Clark |
| 3,975,184 A | 8/1976 | Akers |
| 4,003,770 A | 1/1977 | Janowiecki et al. |
| 4,166,880 A | 9/1979 | Loferski et al. |
| 4,240,842 A | 12/1980 | Lindmayer |
| 4,376,740 A | 3/1983 | Uda et al. |
| 4,449,286 A | 5/1984 | Dahlberg |
| 4,610,718 A | 9/1986 | Araya et al. |
| 4,610,857 A | 9/1986 | Ogawa et al. |
| 4,732,369 A | 3/1988 | Araya et al. |
| 4,812,166 A | 3/1989 | Saiki et al. |
| 5,360,745 A | 11/1994 | Sasaki et al. |
| 5,460,701 A | 10/1995 | Parker et al. |
| 5,514,349 A | 5/1996 | Parker et al. |
| 5,665,277 A * | 9/1997 | Johnson et al. ................. 264/6 |
| 5,874,684 A * | 2/1999 | Parker et al. .................. 75/228 |

* cited by examiner

Primary Examiner—Timothy Meeks

(57) ABSTRACT

A method for depositing a coating onto a solid substrate for the fabrication of a functional layer in a solar cell device wherein the functional layer is used as an anti-reflection layer, an active layer for photon absorption and charge generation, a buffer layer, a window layer, or an electrode layer. The method includes: (a) providing an ionized arc nozzle that includes a consumable electrode, a non-consumable electrode, and a working gas flow to form an ionized arc between the two electrodes, wherein the consumable electrode provides a metal material vaporizable therefrom by the ionized arc; (b) operating the arc nozzle to heat and at least partially vaporize the metal material for providing a stream of nanometer-sized vapor clusters of the metal material into a coating chamber in which the substrate is disposed; (c) introducing a stream of a reactive gas into the coating chamber to impinge upon the stream of metal vapor clusters and exothermically react therewith to produce substantially nanometer-sized compound semiconductor or ceramic clusters; and (d) directing the compound semiconductor or ceramic clusters to deposit onto the substrate for forming the coating.

21 Claims, 2 Drawing Sheets

MANUFACTURING METHOD FOR THIN-FILM SOLAR CELLS

FIELD OF THE INVENTION

The present invention is directed to a method for producing thin films or coatings on a solid substrate. These thin films or coatings can be used in an anti-reflection layer, light-absorbing and charge-generating active layer, window or buffer layer, and/or electrode layer in a thin-film solar cell.

BACKGROUND OF THE INVENTION

Thin-film solar cells or photovoltaic (PV) devices convert sunlight directly into DC electrical power. These multi-layer PV devices are typically configured to include an active layer, which is typically a cooperating sandwich of p-type, intrinsic (i-type), and n-type semiconductors. With appropriately located electrical contacts being included, the structure forms a working PV cell. When sunlight incident on PV cells is absorbed in the semiconductor, electron-hole pairs are created. The electrons and holes are separated by an electric field of a junction in the PV device. The separation of the electrons and holes by the junction results in the generation of an electric current and voltage. The electrons flow toward the n-type region and the holes flow toward the p-type region of the semiconductor material. Current will flow through an external circuit connecting the n-type region to the p-type region as long as light continues to generate electron-hole pairs in the PV device. Solar cells are typically arranged into PV modules by connecting the front of one cell to the back of another, thereby adding the voltages of the individual cells together. A large number of cells, typically 36 to 50, are required to be connected in series to achieve a nominal usable voltage of 12 to 18 V.

The last decade has seen a dramatic increase in commercial use and interest in thin-film PV devices. However, a wider scale commercial use of PV devices for bulk power generation remains limited primarily due to two factors: performance and cost. Recently, dramatic improvements in PV module performance have been achieved in both bulk crystalline silicon and thin film PV devices. The efficiency of laboratory scale crystalline silicon is approaching 20%, while modules with an efficiency ranging from 10 to 14% are commercially available from several vendors. Laboratory scale thin-film PV devices with efficiencies of well above 10% have been achieved with copper indium diselenide (CIS), cadmium telluride, amorphous silicon, and microcrystalline silicon. Most notably, a record efficiency of 18.8% has been achieved for copper indium gallium diselenide (CIGS). Additionally, several companies have achieved thin-film large-area modules with efficiencies ranging from 8 to 12%. Although there is still a great deal of room for further efficiency improvements, performance no longer seems to be the key limiting factor. Cost now appears to be the primary factor preventing wide-scale commercialization of PV modules for power generation.

Key areas that dictate the final product cost for a PV device includes capital equipment costs, deposition rates, layer thickness, materials costs, yields, substrates, and front and back end costs [Zweibel]. The present invention was made by taking these factors into consideration. Our work has emphasized the reduction in capital equipment cost, dramatically increased deposition rate, reduced layer thickness, reduced amount of material used, and alternative substrates. In order to illustrate why the present invention stands out as a major advancement in the field of thin-film solar cell technology, the state-of-the-art of this technology is briefly reviewed as follows:

Amorphous silicon has been made into thin film semiconductors by plasma enhanced chemical vapor deposition (PECVD), or simply plasma discharge or glow discharge, as disclosed by U.S. Pat. No. 5,016,562. Other processes used to make thin film semiconductors include cathode atomization, vapor deposition in a vacuum, high-frequency vaporization in a hydrogen-containing environment, electro-deposition, screen printing and close-spaced sublimation. The close-spaced sublimation process has been used with cadmium telluride and is performed by inserting a glass sheet substrate into a sealed chamber that is then heated. The glass sheet substrate is supported at its periphery in a very close relationship, normally 2 to 3 mm, to a source material of cadmium telluride. After the heating has proceeded to about 450° C.–500° C., the cadmium telluride begins to sublime very slowly into elemental cadmium and tellurium and, upon reaching a temperature of about 650°–725° C., the sublimation is at a greater rate and the elemental cadmium and tellurium recombines at a significant rate as cadmium telluride on the downwardly facing surface of the peripherally supported glass sheet substrate. The heating is subsequently terminated prior to opening of the chamber and removal of the substrate with the cadmium telluride deposited on the substrate. Thus, the deposition of the cadmium telluride is at a varying temperature that increases at the start of the processing and decreases at the end of the processing. Furthermore, the largest area on which such close-spaced sublimation has previously been conducted is about 100 $cm^2$. Increasing the size of the substrate can cause problems in maintaining planarity since the heated substrate which is supported at only its periphery will tend to sag at the center.

Several methods have been proposed for producing the copper indium diselenide (CIS) active layer, such as a three-source simultaneous-deposition method, a spraying method, a two-stage selenidation method, a selenidation method using $H_2Se$, a sputtering method, and an electro-deposition method. The three-source simultaneous-deposition method requires a deposition apparatus having a vacuum chamber which contains Cu, In, and Se evaporation sources. The three elements are evaporated simultaneously from their respective sources and deposited onto a substrate preheated to 350–400° C. Other methods for producing thin-film PV devices include solution spraying, spray pyrolysis, and combined plasma CVD and sputtering.

Optically transparent and electro-conductive electrodes can be obtained by two primary methods. The first method involves producing a metal oxide thin film, such as indium-tin oxide (ITO) or antimony-tin oxide (ATO), on a transparent glass or plastic substrate by sputtering or chemical vapor deposition (CVD). The second method involves solution-coating a transparent, electro-conductive ink on a support such as a glass substrate. The ink solution composition contains a powder of ultra-fine, electro-conductive particles having a particle size smaller than the smallest wavelength of visible rays. The ink is then dried on the support, which is then baked at temperatures of 400° C. or higher.

The first method requires the utilization of expensive devices and its reproducibility and yield are low. Furthermore, the procedure is tedious and time-consuming, typically involving the preparation of fine oxide particles, compaction and sintering of these fine particles to form a target, and then laser- or ion beam-sputtering of this target in a high-vacuum environment. Therefore, it was difficult to obtain transparent electro-conductive coatings that are of low prices. The electro-conductive film formed on the support by the second method tends to have some gaps remaining between the ultra-fine particles thereon so that light scatters on the film, resulting in poor optical properties. In order to fill the gaps, heretofore, a process has been proposed in which a glass-forming component is incorporated into the transparent, electro-conductive ink prior to forming the transparent, electro-conductive substrate. However, the glass-forming component is problematic in that it exists between the ultra-fine, electro-conductive particles, thereby increasing the surface resistivity of the electro-conductive film to be formed on the support. For this reason, therefore, it was difficult to satisfy both the optical characteristics and the desired surface resistivity conditions of the transparent, electro-conductive substrate by the above-mentioned second method. In addition, the transparent, electro-conductive substrate formed by the second method has exhibited poor weatherability. When the substrate is allowed to stand in air, the resistance of the film coated thereon tends to increase with time.

Prior art methods or processes and apparatus for producing thin-film solar cells suffer the following shortcomings:
(1) Most of the processes are relatively slow, resulting in low production rates. These include plasma CVD and sputtering processes.
(2) Processes that involve a high-vacuum environment are essentially limited to a batch-wise, non-continuous production of the PV devices. They are not amenable to the mass production of PV modules or systems.
(3) Most of the PV-producing apparatus and systems make use of expensive equipment, e.g. a laser beam or ion beam source in sputtering.
(4) Several processes rely on the utilization of expensive precursor chemicals such as silane ($SiH_4$), diborane ($B_2H_6$), cadmium acetate, indium trichloride, and thiourea. Some by-products (e.g. HCl) of a decomposition process such as CVD or PECVD are not environmentally friendly.
(5) Most of the prior art processes are only applicable to the deposition of one substrate layer or functional film of a specific material composition, but not sufficiently versatile to permit deposition of different layers of a PV device. For instance, a technique that is good for making an amorphous Si layer may not be good for making a conductive and transparent coating on a substrate.

A high-rate thin-film deposition technique is flame, arc, or plasma spraying. For instance, Janowiecki, et al. (U.S. Pat. No. 4,003,770, Jan. 18, 1977) disclosed a plasma spraying process for preparing polycrystalline solar cells. A doped silicon powder was injected into a high temperature ionized gas or plasma to become molten and to be sprayed onto a substrate. Upon cooling, a dense polycrystalline silicon film was obtained. Then, a p-n junction was formed on the sprayed film by spray deposition, diffusion or ion implantation. A similar plasma thermal spray technique was used by Sasaki, et al. (U.S. Pat. No. 5,360,745, Nov. 1, 1994) to produce a solar cell substrate, by Lindmayer (U.S. Pat. No. 4,240,842, Dec. 23, 1980) to deposit metal contacts to PV electrodes, and by Loferski, et al. (U.S. Pat. No. 4,166,880, Sep. 4, 1979) to coat a layer of semiconductor over a metallic surface. This conventional plasma spray approach has exhibited several drawbacks. Firstly, since the powder particles were melted, but not vaporized, to become melt droplets prior to deposition onto a solid substrate, the produced coatings tend to be porous and non-homogeneous. These poor quality coatings were not very suitable for use in a high-efficiency solar cell. Second, these liquid droplets are typically micrometer- or millimeter-sized and, hence, the resulting coatings are relatively thick, typically thicker than several tens of $\mu m$ and often on the order of several hundreds of $\mu m$. This is undesirable for the production of thin-film solar cells, wherein individual layers are preferably 1 $\mu m$ or thinner.

Dahlberg (U.S. Pat. No. 4,449,286, May 22, 1984) disclosed an improved plasma spray method for producing a semiconductor solar cell. The energy density in the plasma zone was maintained sufficiently high that the semiconductor vaporized and was brought out of the plasma zone in the form of a "vapor jet", which was condensed on the substrate to form a semiconductor layer. However, there are still several shortcomings associated with Dahlberg's method. This plasma spraying process made use of a vapor jet, in which a high speed gas stream carries a high concentration of vapor clusters toward and deposit onto a solid substrate. The deposited layers tended to be relatively thick, typically in the range of 20 $\mu m$ to 200 $\mu m$ according to Dahlberg's specification. This thickness range falls way outside of the desired thickness range for thin-film solar cells. Thinner layers not only use a lesser amount of the semiconductor material, but also allow a larger number of single p-i-n junctions to be integrated together to obtain a more effective absorption of a full solar spectrum of wavelengths. Furthermore, thinner layers are more stable with respect to the Staebler-Wronski effect. The high speed gas-vapor jet also made it difficult to produce large-area, homogeneous coatings. Further, with a high-speed gas flow, it was difficult to ensure that all inputted solid powder particles were completely vaporized when traversing through the plasma zone. Dahlberg failed to fairly suggest how complete vaporization could be achieved. In the field of plasma spraying, the maintenance of a stable and constant-speed powder feeding is known to be a difficult task to accomplish. This issue was not addressed in Dahlberg's patent. An unstable or non-constant feeding of powder particles resulted in coatings of non-uniformity and poor quality.

The present invention has been made in consideration of these problems in the related prior arts. One object of the present invention is to provide a cost-effective method for directly forming individual anti-reflection, active, and electrode layers without going through the intermediate steps. For instance, a transparent, electrically conductive coating (serving as an anti-reflection layer) can be directly deposited onto a p-i-n junction active layer without having to go through intermediate steps such as powder production, compaction and sintering of powder to form a target, and then the sputtering. In order to produce a uniform and thin coating on a solid substrate, it is essential to produce depositable oxide, selenide, sulfide, telluride, semiconductor, and metal species that are in the vapor state prior to striking the substrate. These species are preferably individual molecules or nanometer-sized clusters that are directed to deposit onto a solid substrate at a speed sufficiently high for the mass production of coatings, but low enough so that ultra-thin films of no more than 1 $\mu m$ in thickness can be readily made.

In one embodiment of the present invention, a method entails producing ultra-fine vapor clusters of oxide species and directing these clusters to impinge upon a substrate, permitting these clusters to become solidified thereon to form a thin transparent coating layer. These nano clusters are produced by operating an ionized arc nozzle in a chamber to produce metal clusters and by introducing an oxygen-containing gas into the chamber to react with the metal vapor clusters, thereby converting these metal clusters into nanometer-sized oxide clusters. The heat generated by the exothermic oxidation reaction can in turn be used to accelerate the oxidation process and, therefore, make the process self-sustaining or self-propagating. The great amount of heat released can also help to maintain the resulting oxide clusters in the vapor state. Rather than cooling and collecting these clusters to form individual powder particles, these nanometer-sized vapor clusters can be directed to form an ultra-thin, nano-grained oxide coating onto a glass or plastic substrate. Selected oxide coatings such as zinc oxide, ITO and ATO, are optically transparent and electrically conductive.

In related prior arts, ionized arc methods have been used for producing nano-scaled powder particles, but not nano-grained thin coatings. For instance, Saiki, et al. (U.S. Pat. No. 4,812,166, Mar. 14, 1989) disclosed a method that involved vaporizing a starting material by supplying this material into a plurality of direct-current (DC) plasma currents combined at a central axis of a work coil for generating high frequency induction plasma positioned under the DC plasma-generated zone. Another example of plasma arc based apparatus for powder production is disclosed by Araya, et al. (U.S. Pat. No. 4,732,369, Mar. 22, 1988 and U.S. Pat. No. 4,610,718, Sep. 9, 1986). The apparatus for producing ultra-fine particles by arc energy comprises a generating chamber for generating ultra-fine particles, an electrode positioned opposite to a base material so as to generate an electric arc, a suction opening for sucking the particles generated in the chamber, a trap for collecting the particles sucked from the suction opening, and a cooler positioned between the suction opening and the trap for cooling the sucked ultra-fine particles. Still another example of a plasma arc based process for synthesizing nano particles was disclosed by Parker, et al. (U.S. Pat. No. 5,460,701, Oct. 24, 1995; U.S. Pat. No. 5,514,349, May 7, 1996 and U.S. Pat. No. 5,874,684, Feb. 23, 1999). The system used in this process includes a chamber, a non-consumable cathode shielded against chemical reaction by a working gas, a consumable anode vaporizable by an arc formed between the cathode and the anode, and a nozzle for injecting at least one of a quench and reaction gas in the boundaries of the arc.

Glazunov, et al. (U.S. Pat. No. 3,752,610, Aug. 14, 1973) disclosed a powder-producing device that includes a rotatable, consumable electrode and a non-consumable electrode. In a method proposed by Clark (U.S. Pat. No. 3,887,667, Jun. 3, 1975), an arc is struck between a consumable electrode and a second electrode to produce molten metal which is collected, held and homogenized in a reservoir and subsequently atomized to produce powdered metals. Akers (U.S. Pat. No. 3,975,184, Aug. 17, 1976) developed a method for powder production, which entails striking an electric arc between an electrode and the surface of a pool of molten material. The arc rotates under the influence of a magnetic field to thereby free liquid particles from the surface of the pool. The liquid particles are then quenched to become a solid powder material. Uda, et al. (e.g., U.S. Pat. No. 4,376,740, Mar. 15, 1983) taught a process for producing fine particles of a metal or alloy. The process involves contacting a molten metal or alloy with activated hydrogen gas thereby to release fine particles of the metal or alloy. The method disclosed by Ogawa, et al. (U.S. Pat. No. 4,610,857, Sep. 9, 1986) entails injecting a powder feed material into a plasma flame created in a reactive gas atmosphere. The powder injection rate is difficult to maintain and, with a high powder injection rate, a significant portion of the powder does not get vaporized by the plasma flame.

It is thus an object of the present invention to adapt improved versions of ionized or plasma arc methods for the production of nano-grained coatings or thin films as constituent layers of a solar cell.

It is another object of the present invention to provide a method for directly depositing an optically transparent and electrically conductive coating onto a solid substrate.

It is still another object of the present invention to provide a method for directly depositing a semiconducting coating onto a solid substrate.

It is a further object of the present invention to provide a method for the mass production of solar cell modules.

SUMMARY OF THE INVENTION

A preferred embodiment of the present invention is an arc-induced metal vapor synthesis or, simply, "arc vapor synthesis" method for producing a functional coating onto a substrate. The method includes four primary steps: (a) providing an ionized arc nozzle that includes a consumable electrode, a non-consumable electrode, and a working gas flow to form an ionized arc between the two electrodes, wherein the consumable electrode providing a metal material vaporizable from the consumable electrode by the ionized arc; (b) operating the arc nozzle to heat and at least partially vaporize the metal material for providing a stream of nanometer-sized metal vapor clusters into a chamber in which the substrate is disposed; (c) introducing a stream of a reactive gas into the chamber to impinge upon the stream of metal vapor clusters and exothermically react therewith to produce substantially nanometer-sized compound semiconductor or ceramic clusters; and (d) directing the compound or ceramic vapor clusters to deposit onto the substrate for forming the coating.

In the first step, the arc vapor synthesis method begins with feeding at least a wire or rod of either a pure metal or metal alloy onto an electrode (referred to as a consumable electrode) in the upper portion of a coating chamber. A rod composed of two or three (or more) metal elements at a predetermined proportion may be fed into the arc zone. Alternatively, two or three rods may be fed concurrently to provide precursor metals at a desired proportion. A non-consumable electrode is disposed in the vicinity of the consumable electrode. The proximal ends of the two electrodes are inclined at an angle relative to each other. The opposite ends of these two electrodes are connected to a high-current power source. In the second step, the high currents strike an ionized arc between the proximal ends of the two electrodes in the presence of a working gas. The ionized arc heats and vaporizes the wire or rod tip to form nano-sized metal vapor clusters. While the leading tip of a wire or rod is being consumed by the arc, the wire or rod is continuously or intermittently fed into an arc zone. This, along with the constant supply of a working gas, helps to maintain a relatively stable arc. In the third step, a reactive gas such as an oxygen-containing gas is introduced into the chamber to react with the metal vapor clusters to form metal compound or ceramic clusters. The oxygen-containing gas serves to provide the needed oxygen for initiating and propagating the exothermic oxidation reaction to form the oxide clusters in the liquid or, preferably, vapor state, which are then directed to deposit onto the substrate to form a thin, nano-grained coating.

The present invention provides a low-cost method that is capable of readily heating up the metal wire to a temperature as high as 6,000° C. In an ionized arc, the metal is rapidly heated to an ultra-high temperature and is vaporized essentially instantaneously. Since the wire or rod can be continuously fed into the arc-forming zone, the arc vaporization is a continuous process, which means a high coating rate.

The presently invented arc vapor synthesis method is applicable to essentially all metallic materials, including pure metals and metal alloys. For solar cell applications, the metal may be selected from the group consisting of aluminum, antimony, bismuth, boron, cadmium, copper, gallium, germanium, indium, lead, tin, and zinc. Indium, tin, zinc, and antimony are currently the preferred choices of metal for practicing the present invention for making conductive and transparent electrode or anti-reflection layers. For metal materials with a high boiling point, a multiplicity of arc nozzles may be used to ensure that the material is thoroughly vaporized.

For the deposition of an oxide layer, the reactive gas may be an oxygen-containing gas, which includes oxygen and, optionally, a predetermined amount of a second gas selected from the group consisting of argon, helium, hydrogen, carbon, nitrogen, chlorine, fluorine, boron, sulfur, phosphorus, selenium, tellurium, arsenic and combinations thereof. Argon and helium are noble gases and can be used as a carrier gas (without involving any chemical reaction) or as a means to regulate the oxidation rate. Other gases may be used to react with the metal clusters to form compound or ceramic phases of hydride, carbide, nitride, chloride, fluoride, boride, sulfide, phosphide, selenide, telluride, and arsenide in the resulting coating if so desired. The method is applicable to essentially all II–VI, III–V, and V–VII compound semiconductors. Sulfides, selenides, and tellurides are particular useful compound semiconductor materials for use in the solar cell active layers. The gas flow rate is preferably adjustable to provide a desired range of coating rates.

If the reactive gas contains oxygen, this reactive gas will rapidly react with the metal clusters to form nanometer-sized ceramic clusters (e.g., oxides). If the reactive gas contains a mixture of two or more reactive gases (e.g., oxygen and nitrogen), the resulting product will contain a mixture of oxide and nitride clusters. If the metal composition is a metal alloy or mixture (e.g., containing both indium and tin elements) and the reactive gas is oxygen, the resulting product will contain ultra-fine indium-tin oxide clusters that can be directed to deposit onto a glass or plastic substrate.

At a high arc temperature, metal clusters are normally capable of initiating a substantially spontaneous reaction with a reactant species (e.g., oxygen or sulphur). In this case, the reaction heat released is effectively used to sustain the reactions in an already high temperature environment.

Another embodiment of the present invention is an arc-induced vapor deposition or, simply "arc vapor deposition" method for depositing a thin semiconductor coating of no greater than a few microns thick (preferably $\leq 1$ $\mu$m) onto a solid substrate for the fabrication of a functional layer in a solar cell device wherein the functional layer can be used as an anti-reflection layer, an active layer for photon absorption and charge generation, a buffer or window layer, or an electrode layer. The method includes three steps: (a) providing an ionized arc nozzle that includes a consumable electrode, a non-consumable electrode, and a working gas flow to form an ionized arc between the two electrodes, wherein the consumable electrode provides a semiconductor material vaporizable therefrom by the ionized arc; (b) operating this arc nozzle to heat and at least partially vaporize the semiconductor material for providing a stream of nanometer-sized vapor clusters of the semiconductor material into a chamber in which the substrate is disposed; and (c) directing the stream of semiconductor vapor clusters to flow toward the substrate and deposit thereon at a flow speed appropriate for forming the ultra-thin semiconductor coating. In this case, the final coating composition is substantially identical to the initial semiconductor feed material.

Advantages of the presently invented method are summarized as follows:

1. In a first embodiment of the method (arc vapor synthesis), a wide variety of metallic elements can be readily converted into nanometer-scaled compound or ceramic clusters for deposition onto a range of substrates including glass, plastic, metal-coated glass, metal-coated plastic, metal, ceramic (including oxide), and semiconductor substrates. The starting metal materials can be selected from any element in the periodic table that is considered to be metallic. In addition to oxygen, reactive gas species may be selected from the group consisting of hydrogen, carbon, nitrogen, chlorine, fluorine, boron, sulfur, phosphorus, selenium, tellurium, arsenic and combinations thereof to form metal hydrides, oxides, carbides, nitrides, chlorides, fluorides, borides, sulfides, phosphide, selenide, telluride, arsenide and combinations thereof. In a second embodiment of the method (arc vapor deposition), the starting feed material could be any vaporizable semiconductor or ceramic material. No known prior-art technique is so versatile in terms of readily producing so many different types of thin semiconductor and ceramic coatings on a substrate.

2. The metal material can be an alloy of two or more elements which are uniformly dispersed. When broken up into nano-sized clusters, these elements remain uniformly dispersed and are capable of reacting with oxygen to form uniformly mixed ceramic coating, such as indium-tin oxide. No post-fabrication mixing treatment is necessary.

3. A wire or rod can be fed into the arc zone at a relatively high rate with its leading tip readily vaporized provided that the ionized arc (or several arcs combined) gives rise to a sufficiently high temperature at the wire tip. This feature makes the method fast and effective and now makes it possible to mass produce functional coatings on a solid substrate cost-effectively for solar cell applications.

4. High quality, dense polycrystalline intrinsic and doped semiconductor films and structures can be fabricated directly from rods or wires. High strength bonding of sprayed semiconductor or ceramic coatings to substrates can be achieved The physical, chemical and electrical properties of the coatings can be controlled by varying the process variables. Films can be deposited in large areas and on complex shapes in thicknesses from tens of nanometers to tens of micrometers. Besides polycrystalline semiconductor active layer, the arc vapor synthesis or deposition process can be used to deposit other portions of the solar cell, namely, electrical conductors and anti-reflective or protective cover layers which must be sufficiently transparent on the area of the cell to be illuminated. The process is mass-production oriented, permitting high deposition rates with good reproducibility. It can be scaled up and automated for routine deposition and all fabrication to achieve cost reductions.

5. The system that is needed to carry out the invented method is simple and easy to operate. It does not require the utilization of heavy and expensive equipment such as a laser or vacuum-sputtering unit. In contrast, it is difficult for a method that involves a high vacuum to be a continuous process. The over-all product costs produced by the presently invented vacuum-free method are very low.

DETAILED DESCRIPTION OF PREFERRED EMBODIMENTS

Figure 1:
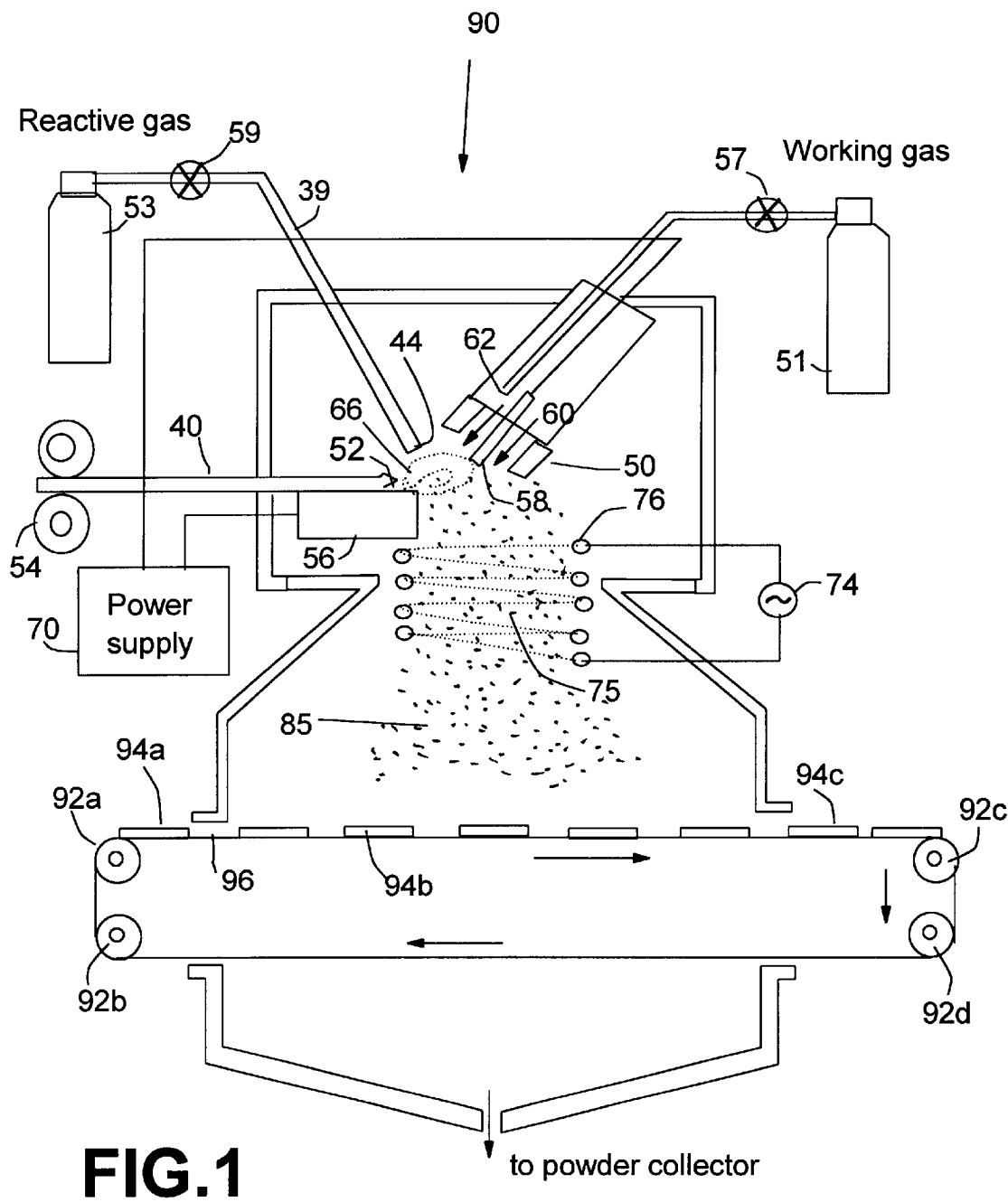
FIG. 1 shows the schematic of a system that can be used in the practice of a preferred embodiment of the presently invented method for producing oxide coating on a substrate.

FIG. 1 schematically shows a coating system that can be used in practicing the method for producing a functional coating on a solid substrate. This apparatus includes four major functional components: (1) a coating chamber 90, (2) an ionized arc nozzle 50 located at the upper portion of the chamber 90, (3) reactive gas-supplier (e.g., a gas bottle 53 supplying a reactive gas through a control/regulator valve 57, pipe 39 and orifice 44 into a location inside the chamber in the vicinity of the ionized arc 66), and (4) substrate supporter-conveyor (e.g., conveying rollers 92a,92b,92c, 92d and belt 96).

An example of the ionized arc system constructed for use in the method in accordance with the invention is shown in FIG. 1 The preparation of a thin, nano-grained coating begins with the vaporization of a precursor material 40 in the chamber 90 via an arc generated, for example, by a water-cooled tungsten inert gas torch 50 driven by a power supply 70. The interior of the chamber 90 may be maintained at the ambient pressure (1 atm), or at a relative pressure of about 20 inches of mercury vacuum up to +3 psi positive pressure (absolute pressure 250 torr to 1000 torr).

The precursor material 40 is melted and vaporized by the transfer of arc energy from a non-consumable electrode 58, such as a thorium oxide-modified tungsten electrode. The non-consumable electrode 58 is shielded by a stream of an inert working gas 60 from a bottle 51 (through a gas control valve/regulator 57 and an orifice 62) to create the arc 66. The working gas 60 acts to shield the non-consumable electrode 58 from an oxidizing environment and then becomes a working plasma gas when it is ionized to a concentration large enough to establish an arc between the non-consumable electrode 58 and a consumable electrode 56.

The consumable precursor material 40 is preferably in the form of a rod or wire which has a diameter of typically from 0.1 mm to 5 mm and is fed horizontally relative to the non-consumable electrode 58. The feed wire or rod 40 of precursor material or metal material is continuously fed to allow a stable arc and continuous production of nano-grained coatings. A continuous production is preferred over batch operation because the process can be run on a more consistent and cost-effective basis. In the cases where two or more metallic elements are to be incorporated in the final coating layer, one may choose to feed a rod or wire of an alloy or metal mixture with the desired element proportion. Alternatively, one may choose to feed two or more rods or wires at the same time with each rod or wire made of one metallic element. The consumable electrode 56 is preferably water-cooled.

The non-consumable tungsten electrode 58 is preferably inclined at an angle with respect to the consumable electrode 56 so as to create an elongated arc flame 66. Depending on the current level, the arc flame 66 can be about one to several inches long. The arc flame 66 acts as a high temperature source to melt and vaporize the leading end 52 of the precursor material 40 to form a stream of metal vapor clusters that are atomic- or nanometer-sized. A reactive gas (e.g. containing oxygen, sulphur, selenium, and/or tellurium) is introduced from the bottle 53 through the orifice 44 into the arc 66. The amount of the reactive gas injected into the arc flame 66 is controlled by a flow meter/regulator 59. Preferably, a concentric gas injection geometry is established around the arc flame 66 to allow homogeneous insertion of the reactive gas. The reactive gas orifice 44 can be positioned at any point along the length of the arc flame 66 as shown in FIG. 1. The gas regulator or control valve 59 is used to adjust the gas flow rate as a way to vary the effective coating rate. The reactive gas impinges upon the metal clusters to initiate and sustain an exothermic reaction between the reactive gas and metal clusters, thereby converting the nano-sized metal clusters into depositable, nano-sized compound or ceramic clusters 85 (e.g., metal oxide, selenide, etc.) that are in the liquid or, preferably, vapor state.

The arc 66, being at an ultra-high temperature (up to 6,000° C.), functions to melt and vaporize the wire tip to generate nano-sized metal vapor clusters. A stream of working gas 60 from a source 51 exits out of the orifice 62 into the chamber to help maintain the ionized arc and to carry the stream of metal vapor clusters downward toward the lower portion of the coating chamber 90. Preferably, the working gas flow and the reactive gas are directed to move in a general direction toward the solid substrate (e.g. 94b) to be coated. In FIG. 1, as an example, this direction is approximately vertically downward.

The wire or rod 40 can be fed into the arc, continuously or intermittently on demand, by a wire-feeding device (e.g., powered rollers 54). The roller speed may be varied by changing the speed of a controlling motor.

The ultra-fine oxide clusters 85 are then directed to deposit onto a solid substrate (e.g., in discrete pieces such as 94b) being supported by a conveyor belt 96 which is driven by 4 conveyor rollers 92a–92d. The lower portion of FIG. 1 shows a train of substrate glass pieces, including 94a (uncoated), 94b (being coated) and 94c (coated). The compound or ceramic clusters that are not deposited will be cooled to solidify and become solid powder particles. These powder particles, along with the residual gases, are transferred through a conduit to an optional powder collector/separator system (not shown).

In another embodiment of the invented method, the wire or rod is made of two metal elements so that a mixture of two types of nano clusters can be produced for the purpose of depositing a hybrid or composite coating material. Alternatively, several wires or rods may be fed into the chamber concurrently.

In a preferred embodiment, the system as defined above may further include a separate plasma arc zone below the ionized arc 66 to vaporize any un-vaporized material dripped therefrom. For instance, a dynamic plasma arc device (e.g., with power source 74 and coils 76 in FIG. 1) may be utilized to generate a plasma arc zone 75 through which the un-vaporized melt droplets dripped out of the ionized arc 66 will have another chance to get vaporized. The creation of a plasma arc zone is well-known in the art. The ultra-high temperature in the plasma arc (up to as high as 32,000° K) rapidly vaporizes the melt droplets that pass through the plasma arc zone.

Figure 2:
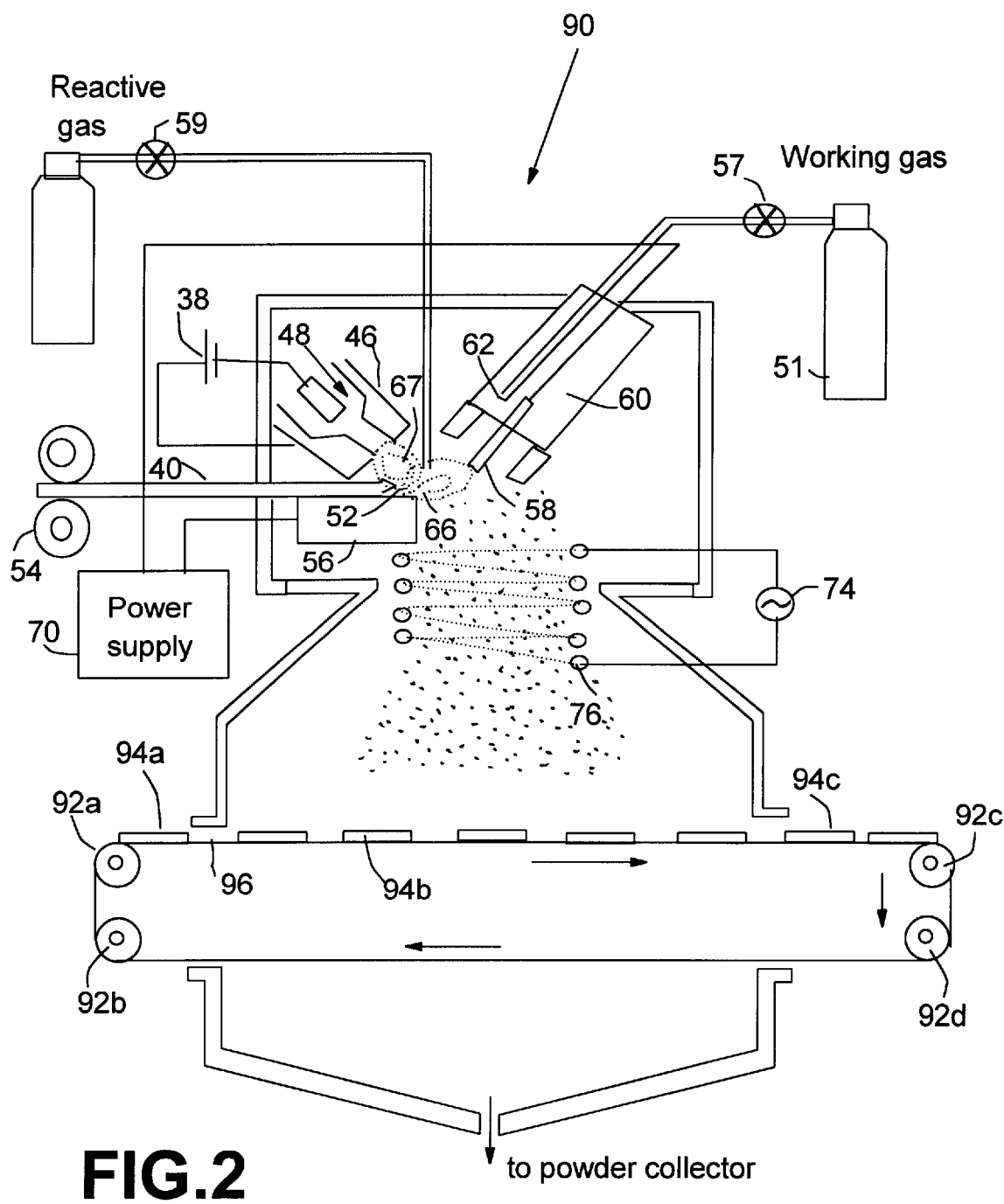
FIG. 2 shows the schematic of another system (a multi-arc system) that can be used in the method for producing oxide coating on a substrate.

The ionized arc 66 tends to produce a metal melt pool or "weld pool" near the leading end 52 of the feed wire 40 on the top surface of the consumable electrode 56 if the arc tail temperature is not sufficiently high to fully vaporize the metal material. The melt in this pool will eventually vaporize provided that an arc is maintained to continue to heat this pool. For the purpose of reducing the duration of time required to fully vaporize the metal material and, hence, increase the coating production rate, it is preferable to operate at least a second plasma or ionized arc nozzle to generate at least a second arc (e.g., 67 in FIG. 2) near the leading end 52 of the feed wire 40. For instance, shown in FIG. 2 is a DC plasma arc nozzle 46 which is driven by a DC power source 38 and a working gas flow 48 to create an arc 67 to provide additional heat energy to the metal wire tip 52.

For the purpose of clearly defining the claims, the word "wire" means a wire of any practical diameter, e.g., from several microns (a thin wire or fiber) to several centimeters (a long, thick rod). A wire can be supplied from a spool, which could provide an uninterrupted supply of a wire as long as several miles. This is a very advantageous feature, since it makes the related coating process a continuous one.

The presently invented method is applicable to essentially all metallic materials (including pure metals and metal alloys). As used herein, the term "metal" refers to an element of Groups 2 through 13, inclusive, plus selected elements in Groups 14 and 15 of the periodic table. Thus, the term "metal" broadly refers to the following elements:

| | |
|---|---|
| Group 2 or IIA: | beryllium (Be), magnesium (Mg), calcium (Ca), strontium (Sr), barium (Ba), and radium (Ra). |
| Groups 3–12: | transition metals (Groups IIIB, IVB, VB, VIB, VIIB, VIII, IB, and IIB), including scandium (Sc), yttrium (Y), titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os). cobalt (Co), rhodium (Rh), iridium (Ir), nickel (Ni), palladium (Pd), platinum (Pt), copper (Cu), silver (Ag), gold (Au), zinc (Zn), cadmium (Cd), and mercury (Hg). |
| Group 13 or IIIA: | boron (B), aluminum (Al), gallium (Ga), indium (In), and thallium (Tl). |
| Lanthanides: | lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). |
| Group 14 or IVA: | germanium (Ge), tin (Sn), and lead (Pb). |
| Group 15 or VA: | antimony (Sn) and bismuth (Bi). |

For solar cell applications, the metal is preferably selected from the group consisting of aluminum, antimony, bismuth, boron, cadmium, copper, gallium, germanium, indium, lead, tin, and zinc. However, for the purpose of producing optically transparent and electrically conductive coating (e.g., for making the anti-reflection or electrode layers in a solar cell), indium, tin, antimony, and zinc are the most preferred metallic elements.

Preferably the reactive gas includes a gas selected from the group consisting of hydrogen, oxygen, carbon, nitrogen, chlorine, fluorine, boron, iodine, sulfur, phosphorus, arsenic, selenium, tellurium and combinations thereof. Noble gases such as argon and helium may be used to adjust or regulate the oxidation rate. Reactive gases may be used to react with the metal clusters to form nanometer-scale compound or ceramic powders of hydride, oxide, carbide, nitride, chloride, fluoride, boride, iodide, sulfide, phosphide, arsenide, selenide, and telluride, and combinations thereof. The range of compound semiconductor or ceramic layers that can be produced by the present arc vapor synthesis method, therefore, include, I–VII, II–VI, and III–V compounds. The method may further include operating means for providing dissociable inert gas mixable with the working gas. The dissociable inert gas serves to increase the temperature gradient in the ionized arc.

If the reactive gas contains a highly reactive gas (e.g., oxygen and sulphur), this reactive gas will rapidly react with the metal clusters to form nanometer-sized ceramic clusters (e.g., oxides). If the reactive gas contains a mixture of two or more reactive gases (e.g., oxygen and selenium), the resulting product will contain a mixture of two compounds or ceramics (e.g., oxide and selenide). If the metal wire is a metal alloy or mixture (e.g., containing both indium and tin elements) and the reactive gas is oxygen, the resulting coating will contain ultra-fine indium-tin oxide.

In summary, a preferred embodiment of the present invention is a method for producing a functional coating onto a solid substrate. This arc vapor synthesis method includes four steps: (a) providing an ionized arc nozzle that includes a consumable electrode, a non-consumable electrode, and a working gas flow to form a first ionized arc between the two electrodes, wherein the consumable electrode provides a metal material vaporizable from the consumable electrode by the ionized arc; (b) operating the are nozzle to heat and at least partially vaporize the metal material for providing a stream of nanometer-sized metal vapor clusters into a chamber in which the substrate is disposed; (c) introducing a stream of a reactive gas into the chamber to impinge upon the stream of metal vapor clusters and exothermically react therewith to produce substantially nanometer-sized compound or ceramic clusters; and (d) directing the compound or ceramic clusters to deposit onto the substrate for forming the coating.

Optionally, the method may include another step of operating a plasma arc means (e.g., a dynamic plasma device including a high-frequency power source 74 and coils 76) for vaporizing any un-vaporized metal after step (c) and before step (d). Also optionally, the method may include an additional step of operating at least a second ionized arc means (e.g., a DC plasma arc nozzle 46 in FIG. 2) for vaporizing any un-vaporized metal after step (b) or compound or ceramic clusters after step (c) but before step (d).

In the presently invented method, the stream of reactive gas or oxygen-containing gas may further include a small amount of a second gas to produce a small proportion of compound or ceramic clusters that could serve to modify the properties of the otherwise pure oxide coating. This second gas may be selected from the group consisting of hydrogen, carbon, nitrogen, chlorine, fluorine, boron, sulfur, phosphorus, arsenic, selenium, tellurium and combinations thereof.

Preferably, the solid substrate in the practice of the present method includes a train of individual pieces of a substrate material (glass, plastic, metal-coated glass, metal-coated plastic, metal, semiconductor, or ceramic) being moved sequentially or concurrently into coating chamber and then moved out of the chamber after the coating is formed. This feature will make the process a continuous one. Alternatively, the substrate may be a flexible substrate that is initially wound around a drum (roll), which rotates to feed continuously from one end into the chamber and is taken up on another drum at another end of the chamber.

In another embodiment of the method, the metal material may include an alloy or mixture of at least two metallic elements, with a primary one occupying more than 95% and the minor one less than 5% by atomic number. The primary one is selected so that its metal vapor clusters can be readily converted to become oxides or other ceramic clusters. However, the minor one may be allowed to remain essentially as nano-sized metal clusters. Upon deposition onto the substrate, the minor metal element only serves as a modifier to the properties (e.g., to increase the electrical conductivity) of the oxide coating. The presence of a small amount of nano-scaled metal domains does not adversely affect the optical transparency of the oxide coating.

In the presently invented arc vapor synthesis method, the stream of reactive gas reacts with the metal vapor clusters in such a manner that the reaction heat released is used to sustain the reaction until most of the metal vapor clusters are substantially converted to nanometer-sized compound or ceramic clusters. The stream of reactive gas may be pre-heated to a predetermined temperature prior to being introduced to impinge upon the metal vapor clusters. A higher gas temperature promotes or accelerates the conversion of metallic clusters to compound or ceramic clusters.

Another embodiment of the present invention is a method for depositing a thin semiconductor coating of no greater than 1 $\mu$m thick onto a solid substrate for the fabrication of a functional layer in a solar cell device. In this arc vapor deposition method, the final coating composition is substantially identical to the initial semiconductor feed material. The ionized arc or plasma flame serves to vaporize or "atomize" the starting semiconducting material that forms a stream of atoms, molecules, or nano-sized atom clusters in a vapor state. These clusters are then directed to flow toward a substrate surface at a speed that is sufficiently high for the mass production of coatings, but sufficiently low so that ultra-thin coatings can be made. Specifically, the method includes three steps: (a) providing an ionized arc nozzle that includes a consumable electrode, a non-consumable electrode, and a working gas flow to form an ionized arc between the two electrodes, wherein the consumable electrode provides a semiconductor material vaporizable therefrom by the ionized arc; (b) operating this arc nozzle to heat and at least partially vaporize the semiconductor material for providing a stream of nanometer-sized vapor clusters of the semiconductor material into a chamber in which the substrate is disposed; and (c) directing the stream of semiconductor vapor clusters to flow toward the substrate and deposit thereon at a flow speed appropriate for forming the ultra-thin semiconductor coating.

The required apparatus used in the arc vapor deposition procedure is similar to that used for the arc vapor synthesis procedure, with the exception that no reactive gas will be introduced in the arc vapor deposition procedure. A same apparatus may be used for carrying out both procedures (with different gas-supplies) or, alternatively, two separate apparatus may be used for two different procedures. A series of arc vapor synthesis and/or arc vapor deposition apparatus can be arranged side by side to produce different functional layers of a solar cell module. In other words, the arc vapor synthesis procedure or arc vapor deposition procedure may be repeated or combined to produce different functional layers, one upon another, in a thin-film solar cell module.

EXAMPLE 1

In the practice of the arc vapor synthesis method, a metal rod of Al, Cu, Sn, or Zn, of 1/8–1 inches diameter was used as a precursor material disposed on a top horizontal surface of the consumable electrode. The non-consumable electrode, which was used as a cathode, was a material consisting of 2% thoriate dispersed in a matrix of W. This electrode was shielded by 25–50 cfh of a working gas of argon combined with 5–100% nitrogen and/or 5–50% hydrogen. The current of the arc was adjusted between approximately 100 and 450 amps, which generated an arc tail flame 1–4 inches long that evaporated the precursor material. The arc created a stream of metal vapor clusters of 1–200 g/hr while an oxygen flow of 10–400 cfh was injected into the tail flame to form an oxide species of the starting metal. These oxide clusters were directed to deposit on a substrate that ranges from metal-coated plastic, metal foil, to glass. The microstructure of the resulting coatings was typically characterized by grain sizes in the range of 1–50 nm. These coatings are used in an anti-reflection layer or an electrode layer.

EXAMPLE 2

A powder mixture of 70% zinc and 30% zinc oxide was compounded into a rod ½" diameter by pressing and sintering. The rod was electrically conductive and used as a precursor material in the consumable electrode or anode. The same cathode as in Example 1 was used and shielded by approximately 50 cfh of a working gas of argon in combined with 5–50% nitrogen or 5–50% hydrogen. The current of the arc ranged from 100–450 amps. The precursor material was evaporated by the arc to produce a vapor of 1–200 g/hr in a plasma tail flame created by the transferred arc. Concurrently, 10–500 cfh oxygen was injected into the tail flame to produce complete zinc oxide clusters. These oxide clusters were directed to deposit onto an aluminum foil. The coatings were found to be nano-grained (5–75 nm) with thickness of 350 nm to 2 $\mu$m, depending on the rod-feeding rate and the gas flow rate.

EXAMPLE 3

The process of Example 1 was repeated except that a copper rod and an indium rod (each approximately ¼ inches or 6 mm in diameter) were supplied as a precursor material at an advancing rate of 5 cm/min. Selenium vapor, carried by an argon gas, was introduced at a rate of 100 cfh to impinge upon the Cu—In vapor clusters generated by an arc flame. The resulting copper indium diselenide (CIS) coating was nano-grained (grain sizes ranging from 35 nm to 75 nm).

EXAMPLE 4

In the practice of the arc vapor deposition method, a substrate made of aluminum is placed inside a coating chamber equipped with an electric arc deposition nozzle as depicted in FIG. 1. Nitrogen is flowed through an electric arc formed between a p-type silicon rod electrode (anode) and a thoriate-dispersed tungsten electrode (cathode), and toward the substrate through a nozzle. The silicon melts and vaporizes in the electric arc with the vapor clusters being slowly propelled onto the substrate by the nitrogen. On the substrate, the silicon vapor condenses to form a p-type polycrystalline silicon layer of 0.2 $\mu$m thick.

EXAMPLE 5

An aluminum-coated glass was used as a substrate. N-type silicon powder was compacted and formed into a rod, which was fed into a coating chamber on the surface of an anode. An electric arc was established between the anode and a cooled tungsten cathode. The stream of vapor clusters were directed to pass through a mask toward the substrate. The silicon clusters condense onto the aluminum layer to form an n-type silicon coating of 0.2 $\mu$m thick.

EXAMPLE 6

An indium oxide/n-silicon hetero-junction solar cell was fabricated by following the two versions of the presently invented method, both arc vapor synthesis and arc vapor deposition. First, an n-type nano-crystalline silicon layer of approximately 0.8 $\mu$m thick was deposited onto the top surface of an aluminum-coated glass substrate (serving as the first electrode) by using a similar arc vapor deposition procedure described in EXAMPLE 5. A thin layer of silicon oxide (approximately 20 Å) was naturally formed on the surface of this silicon layer by surface heat treating. An indium oxide layer of approximately 1,200 Å was then deposited onto the silicon oxide layer by using an arc vapor synthesis procedure similar to that in EXAMPLE 1. A comb-shaped top electrode layer of zinc was deposited on the indium oxide layer to form the second electrode. The resulting solar cell was found to exhibit a conversion efficiency that exceeds 10%.

EXAMPLE 7

A substrate of porcelain was coated on its upper side with a layer of copper (1.5 $\mu$m) as a metal back electrode layer. Coated on this zinc layer is a p-type light-absorbing layer of copper indium gallium diselenide (CIGS) of approximately 2 $\mu$m thick. A procedure similar to EXAMPLE 3 was followed to produce this CIGS coating with an anode rod prepared through compaction of Cu, In, and Ga powders. An intrinsic ZnO layer (0.8 $\mu$m) was then deposited onto the CIGS coating surface by using a procedure similar to that in EXAMPLE 1. The top surface of this ZnO layer was doped with aluminum to obtain an n-type ZnO layer. An aluminum top electrode was then vapor deposited through a mask onto the n-type ZnO layer to form a thin-film solar cell module. A solar conversion efficiency of approximately 14% was achieved with this module.

What is claimed:

1. An arc vapor synthesis method for depositing a coating onto a solid substrate for the fabrication of a functional layer in a solar cell device wherein said functional layer is used as an anti-reflection layer, an active layer for photon absorption and charge generation, a buffer layer, a window layer, or an electrode layer, said method comprising:

(a) providing an ionized arc nozzle means comprising a consumable electrode, a non-consumable electrode, and a working gas flow to form an ionized arc between said consumable electrode and said non-consumable electrode, wherein said consumable electrode provides a metal material vaporizable therefrom by said ionized arc;

(b) operating said arc nozzle means to heat and at least partially vaporize said metal material for providing a stream of nanometer-sized vapor clusters of said metal material into a chamber in which said substrate is disposed;

(c) introducing a stream of a reactive gas into said chamber to impinge upon said stream of metal vapor clusters and exothermically react therewith to produce substantially nanometer-sized compound semiconductor or ceramic clusters; and (d) directing said compound semiconductor or ceramic clusters to deposit onto said substrate for forming said coating.

2. The method as set forth in claim 1, further comprising a step of operating at least a second ionized arc nozzle means for the purpose of completely vaporizing said metal material.

3. The method as set forth in claim 1, further comprising a step of operating a separate plasma arc means for vaporizing any un-vaporized compound semiconductor or ceramic clusters after step (c) and before step (d).

4. The method as set forth in claim 1, 2, or 3, wherein said metal material comprises at least one metallic element selected from the group consisting of copper, zinc, cadmium, boron, aluminum, gallium, indium, germanium, tin, lead, antimony, and bismuth.

5. The method as set forth in claim 1, 2, or 3, wherein said metal material comprises copper and indium elements.

6. The method as set forth in claim 1, 2, or 3, wherein said stream of a reactive gas comprises a gas selected from the group consisting of oxygen, hydrogen, carbon, nitrogen, chlorine, fluorine, bromine, iodine, sulfur, phosphorus, selenium, tellurium, arsenic and combinations thereof.

7. The method as set forth in claim 1, 2, or 3, wherein said solid substrate comprises a train of individual pieces of a substrate material being moved sequentially or concurrently into said chamber and then moved out of said chamber after said coating is formed.

8. The method as set forth in claim 1, 2, or 3, wherein said metal material comprises an alloy of at least two metallic elements.

9. The method as set forth in claim 1, 2, or 3, wherein said stream of a reactive gas reacts with said metal vapor clusters in such a manner that the reaction heat released is used to sustain the reaction until most of said metal vapor clusters are substantially converted to nanometer-sized compound or ceramic clusters.

10. The method as set forth in claim 1, 2, or 3, wherein said stream of a reactive gas is pre-heated to a predetermined temperature prior to being introduced to impinge upon said metal vapor clusters.

11. The method as defined in claim 1, 2, or 3 wherein said working gas is selected from the group consisting of nitrogen, hydrogen, noble gases and mixtures thereof.

12. The method as defined in claim 1, 2, or 3 wherein said working gas comprises dissociable inert gas for increasing the temperature gradient in said ionized arc.

13. The method as set forth in claim 1, 2, or 3, wherein said functional layer comprises a coating selected from the group consisting of copper indium diselenide, copper indium gallium diselenide, copper indium aluminum diselenide, copper indium boron diselenide, cadmium sulfide, cadmium telluride, tin oxide, indium-tin oxide, and antimony oxide.

14. The method as set forth in claim 1, 2, or 3, further including, after step (d), a step of heat treating the obtained coating to effect a change in a physical state of the coating.

15. The method as set forth in claim 1, 2, or 3, wherein said steps (a) through (d) are conducted to produce a first coating and steps (a) through (d) are then repeated to produce at least a second coating onto said first coating to produce a multiple-coating device.

16. An arc vapor deposition method for depositing a thin semiconductor coating of no greater than 1 $\mu$m thick onto a solid substrate for the fabrication of a functional layer in a solar cell device wherein said functional layer is used as an anti-reflection layer, an active layer for photon absorption and charge generation, a buffer layer, a window layer, or an electrode layer, said method comprising:

(a) providing an ionized arc nozzle means comprising a consumable electrode, a non-consumable electrode, and a working gas flow to form an ionized arc between said consumable electrode and said non-consumable electrode, wherein said consumable electrode provides a semiconductor material vaporizable therefrom by said ionized arc;

(b) operating said arc nozzle means to heat and at least partially vaporize said semiconductor material for providing a stream of nanometer-sized vapor clusters of said semiconductor material into a chamber in which said substrate is disposed; and (c) directing said stream of semiconductor vapor clusters to flow toward said substrate and deposit thereon at a flow speed appropriate for forming said thin semiconductor coating.

17. The method as set forth in claim 16, further comprising a step of operating at least a second ionized arc nozzle means for the purpose of completely vaporizing said semiconductor material.

18. The method as set forth in claim 16, wherein said semiconductor material is selected from the group consisting of silicon, germanium, a III–V compound, a II–VI compound, copper indium diselenide, copper indium gallium diselenide, copper indium aluminum diselenide, copper indium boron diselenide, or a combination thereof.

19. The method as set forth in claim 16 or 17, further including, after step (c), a step of heat treating the obtained coating to effect a change in a physical state of the coating.

20. The method as set forth in claim 1, 2, 3, 16, or 17 wherein said substrate is selected from the group consisting of a metal, ceramic, semiconductor, plastic, metal-coated glass, or metal-coated plastic substrate.

21. The method as set forth in claim 16 or 17, wherein said steps (a) through (c) are conducted to produce a first coating and steps (a) through (c) are then repeated to produce at least a second coating onto said first coating to produce a multiple-coating device.

* * * * *